(12) United States Patent
Chen et al.

(10) Patent No.: US 7,163,829 B2
(45) Date of Patent: Jan. 16, 2007

(54) METHOD OF INTEGRATION TESTING FOR PACKAGED ELECTRONIC COMPONENTS

(75) Inventors: Kuei-Pao Chen, Hsin Chu (TW); Tsan-Hsiung Lai, Hsin Chu (TW)

(73) Assignee: Youngtek Electronics Corporation, Hsin Chu (TW)

( * ) Notice: Subject to any disclaimer, the term of this patent is extended or adjusted under 35 U.S.C. 154(b) by 166 days.

(21) Appl. No.: 11/041,980

(22) Filed: Jan. 26, 2005

(65) Prior Publication Data
US 2006/0166380 A1    Jul. 27, 2006

(51) Int. Cl.
*H01L 21/00* (2006.01)
(52) U.S. Cl. .............................. 438/15; 438/11; 438/14; 257/48; 257/E21.524
(58) Field of Classification Search ................ 438/11, 438/14, 15
See application file for complete search history.

(56) References Cited

U.S. PATENT DOCUMENTS 5,240,866 A * 8/1993 Friedman et al. ............. 702/35
6,274,395 B1 * 8/2001 Weber .......................... 438/14

* cited by examiner

*Primary Examiner*—Dung A. Le
(74) *Attorney, Agent, or Firm*—Troxell Law Office, PLLC

(57) ABSTRACT

A method of integration testing for packaged electronic components is capable of improving a conventional testing for packaged electronic components. In this method, non-tested sides of the packaged electronic components are stuck with a downward exposure onto a testing carrier board so that conductive pins are oriented to test spaces to test the plurality of packaged electronic components stuck onto the testing carrier board according to testing steps for convenient classification packaging, advanced testing efficiency, economical working hours and costs. Programmable features and man-hour saving are provided for easy mass production and testing.

10 Claims, 9 Drawing Sheets

Bin criteria(Example)

| (FE-FD-BL_02) | | Customer Name | 1 | 2 |
|---|---|---|---|---|
| | | OEM Delivery Date | | |
| | | PC LOT No. | C04A21A04 | D04B15D05 |
| Bin | SPEC | | | |
| 1 | 20A5D321 | | 0 | 0 |
| 2 | 20B5D321 | | 0 | 0 |
| 3 | 20C5D321 | | 0 | 0 |
| 4 | 20A5E321 | | 0 | 0 |
| 5 | 20B5E321 | | 0 | 0 |
| 6 | 20C5E321 | | 0 | 0 |
| 7 | 20B5F321 | | 252 | 0 |
| 8 | 20C5F321 | | 0 | 0 |
| 9 | 20D5F321 | | 0 | 0 |
| 10 | 20B5G321 | | 6920 | 2340 |
| 11 | 20C5G321 | | 829 | 1087 |
| 12 | 20D5G321 | | 0 | 0 |
| 13 | 20B6D321 | | 177 | 845 |
| 14 | 20C6D321 | | 2250 | 6310 |
| 15 | 20D6D321 | | 0 | 0 |
| 16 | 20E6D321 | | 0 | 0 |
| 17 | 20F6D321 | | 0 | 0 |
| 18 | 20B6E321 | | 0 | 12 |
| 19 | 20C6E321 | | 1 | 3145 |
| 20 | 20D6E321 | | 0 | 1201 |
| 21 | 20E6E321 | | 0 | 0 |
| 22 | 20F6E321 | | 0 | 0 |
| 23 | 20Z6F1 | | 6615 | 2577 |
| Total | | | 17044 | 17517 |
| 24 | Other | | 1011 | 200 |
| 25 | O/S Fail | | 2262 | 2687 |
| Total tested pieces (except Open Fail) | | | 18807 | 18787 |

FIG. 4

METHOD OF INTEGRATION TESTING FOR PACKAGED ELECTRONIC COMPONENTS

BACKGROUND OF THE INVENTION

1. Field of the Invention

This invention relates to a method of integration testing for packaged electronic components and particularly to a capability of technology to improve a conventional testing for packaged electronic components of the quad flat no-lead type (QFN). In this method, non-tested sides of the packaged electronic components are stuck with a downward exposure onto a testing carrier board so that conductive pins are oriented to test spaces to test the plurality of packaged components stuck onto the testing carrier board according to testing steps for convenient classification packaging, advanced testing efficiency, economical working hours and costs, simplified testing procedures, and raised efficiency, and thus the invention for an improvement of low cost and high efficiency may be used in most locations with production lines testing the packaged electronic components.

2. Description of Related Art

In a semiconductor manufacturing process, there are four flows divided into IC design, wafer fabrication (Wafer Fab), wafer probe, and wafer packaging. In wafer probe, each die on a chip is probed and a probe made of a gold wire as thin as hair is fit on a head of the detector contacts pad on the die to test for electrical characteristics. Unqualified dice are marked. Next, when the chip is cut into dice in units of die, marked die or dice are unqualified and eliminated and thus do not pass to a next process to avoid wasting manufacturing costs. Wafer packaging is the last process of the entire semiconductor manufacturing processes, mainly packaging a cut single IC with a mold.

To improve the performance of the production line for the testing of packaged electronic components is an item various wafer OEMs actively develop and build, and the technology, such as that for improving production flows, may be applicable in all kinds of locations to test packaged chips so as to reduce the manufacturing and working-hour costs. So far, to improve testing flow has been a very important item because a chip packaging testing machine is a much more precise machine, and thus even slight modifications of the machine are always expensive. Peripheral flows, however, may be improved matching with indigenous features of machines for producing a marked effect with relative lower cost. In particular, before and after the packaging process, the characteristics of chip may be impacted and part of the wafer to be tested is guaranteed in quality. The testing must thus be performed for leveling after packaging process, and chip circuits that are slightly different from each other in a series of products or chip circuits of different products at the time of layout usually may be laid on the same piece of wafer, so a fast, efficient method of leveling a product testing must be found for the packaged electronic components after cutting and packaging, regardless of their quality or product classification.

Generally known packaging types are divided into dual in-line package (DIP), chip size package (CSP), small outline package (SOP), quad flat no-lead (QFN, same as dual flat no-lead (DFN) in series) package, plastic leaded chip carrier (PLCC) package, ball grid array (BGA) package, and special FCP. Various customized packages are being developed as well. Generalized semiconductor packages also comprise an LED sensor and a specific IC package, and applications in different fields depend on demands of different industries and characteristics of semiconductor elements.

FIG. 1A is a view of a bottom-surface QFN package and FIG. 1B is a view of a DFN package; a conventional packaged structure of packaged electronic component described herein generally has a top side commonly provided with no circuit contacts that may be lateral leads or contacts and also bottom-surface contacts (seen as 4 rows of blocks in FIG. 1A and as 2 rows of blocks in FIG. 1B); however, before a testing of the electronic component after packaging is performed, separate small grains of chips must be mounted, which is, generally speaking, a complicated flow. The testing flow in particular runs slower.

SUMMARY OF THE INVENTION

It is the object of this invention to provide a method of integration testing for packaged electronic components; namely, a method for a new testing flow, implemented with a highly efficient structure on a convenient peripheral-based automatic machine, and applicable in testing locations for packaged products with the packaged electronic components for speedy testing and precise classification packaging (into chip tapes).

In order to achieve the object mentioned above, according to this invention, a top side of a packaged component is stuck downward onto a testing carrier board (that may serve as a chip-assistant membrane tape—blue tape or similar one—used in industries) so that conductive pins are oriented to test spaces to test a plurality of the packaged components stuck onto the testing carrier board according to testing steps for improvement of the testing quality and functionality in that the way of sticking of the packaged electronic component onto the testing carrier board may definitely have the component mounted for an automation of the testing process. Additionally, the plurality of packaged electronic components may be stuck with viscose so that lots of chips may at one time be provided with high precision of alignment and that the testing efficiency may also be improved, which even assists classification implementation according to different levels and different types that are both required for separate loading of chip tapes and to a production line performing a flexible adjustment testing and packaging through a computer program.

The method according to this invention comprises the following steps. A plurality of packaged electronic components or an entire piece of the plurality of packaged electronic components are mounted onto the testing carrier board. The testing carrier board mounted on the packaged electronic components is tested and then test data given from each packaged electronic component are recorded. The data from the component, including all packaged electronic component function lists organized after testing, may be shown and saved with image or literal data. The packaged electronic components are classified according to the image or literal data for packaging.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 4 is a view illustrating a table of test data given from each packaged electronic component, including each bin number of package bin according to each chip function after a test, according to an embodiment of this invention;

DETAILED DESCRIPTION OF THE PREFERRED EMBODIMENTS

Figure 8:
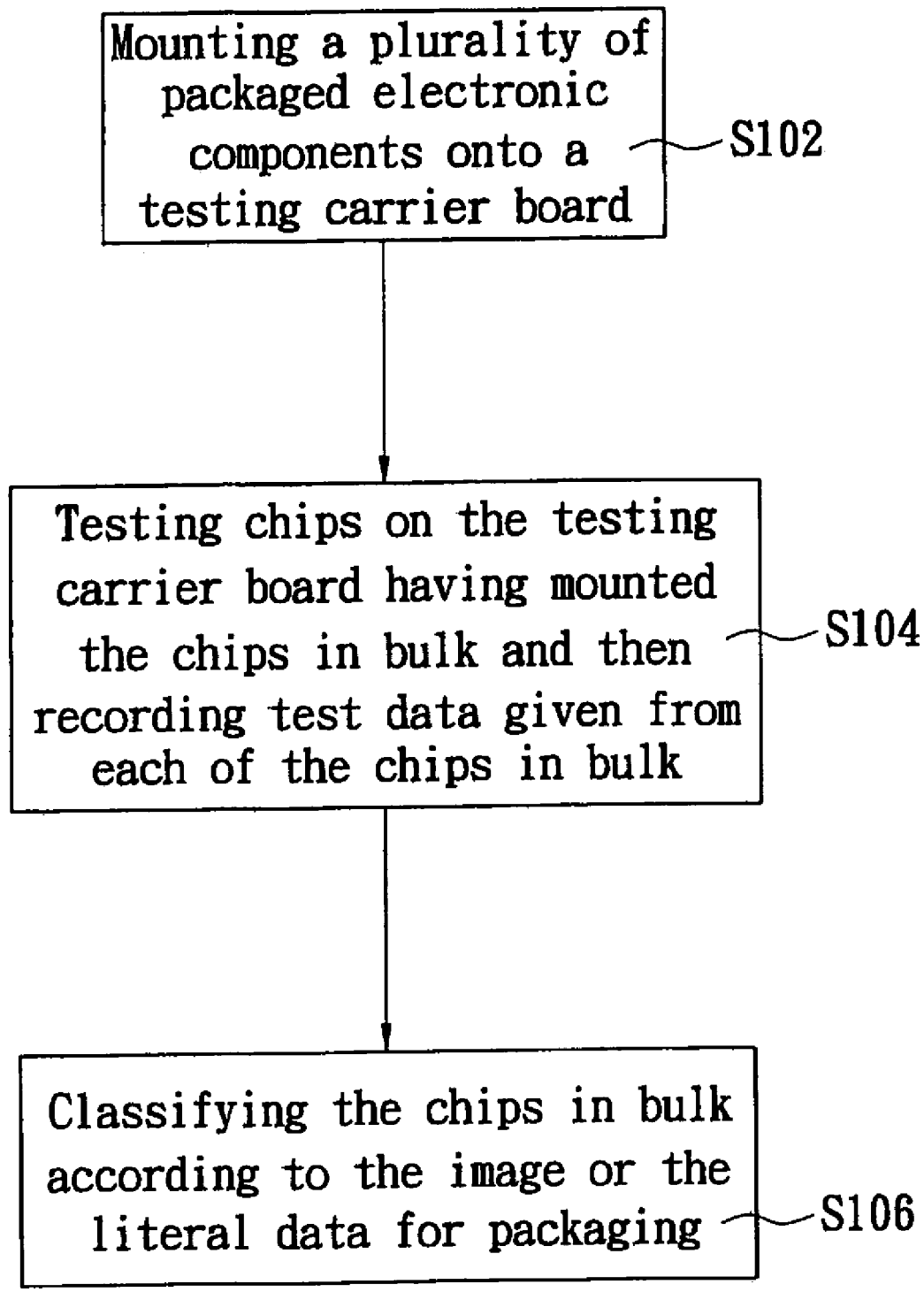
FIG. 8 is a flow chart illustrating steps of the method according to this invention.

Referring now to a below-mentioned description of an operation principle according to this invention, a (top) side of a packaged electronic component 10 provided with no externally conductive test contact is stuck downward onto a testing carrier board 20 (that may serve as a chip-assistant membrane tape—blue tape or similar one—used in industries) so that conductive pins are oriented to test spaces to test a plurality of the packaged electronic components 10 stuck onto the testing carrier board 20 according to testing steps. This improves the testing quality and functionality in that the way of sticking of the packaged electronic component 10 onto the testing carrier board 20 may definitely have the component 10 mounted and integrated for an automation of the testing process. Additionally, the packaged electronic component 10 may be stuck with a material that may not expand onto a metallic mounted area of a predetermined location so that lots of chips may at one time be provided with high precision of alignment and the testing efficiency may also be improved. Efficiency is not high when a single chip sampled from the chips in bulk is tested, and fixtures are not easily designed and repaired; however, packaged chips well integrated and arranged are extremely convenient for testing, which even assists classification implementation according to different levels and different types that are both required for separate loading of chip tapes. Referring now to FIG. 8, a flow chart according to a method of this invention illustrates steps of this invention.

Figure 1A:
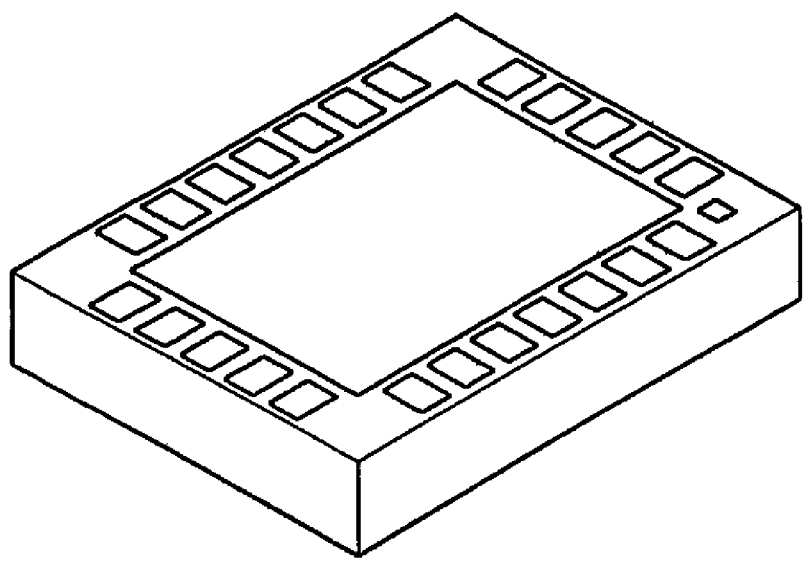
FIG. 1A is a view illustrating conventional quad flat no-lead (QFN) packaging.
Figure 1B:
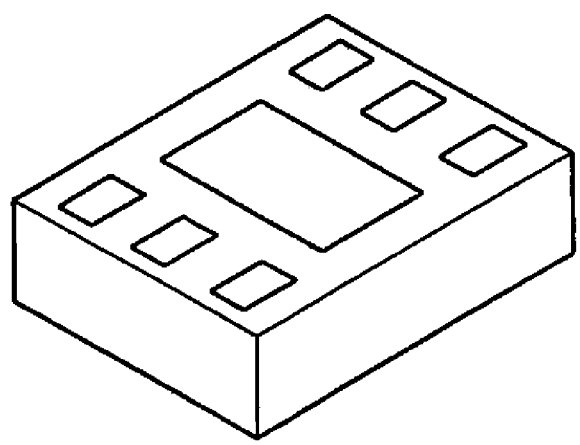
FIG. 1B is a view illustrating conventional dual-line flat no-lead (DFN) packaging.
Figure 2A:
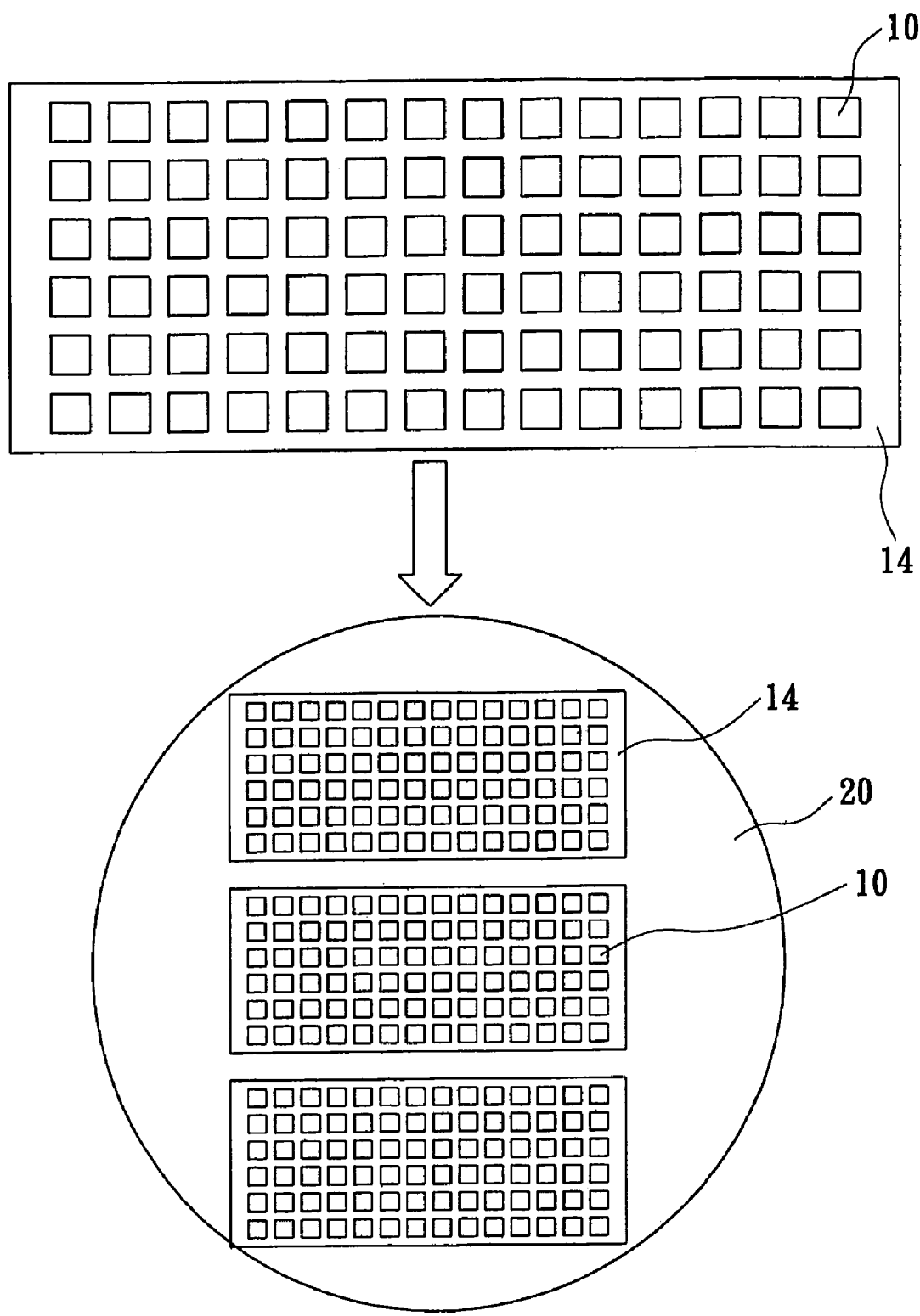
FIG. 2A is a view illustrating a step of mounting an entire piece of a plurality of packaged electronic components onto a testing carrier board according to an embodiment of this invention.
Figure 2B:
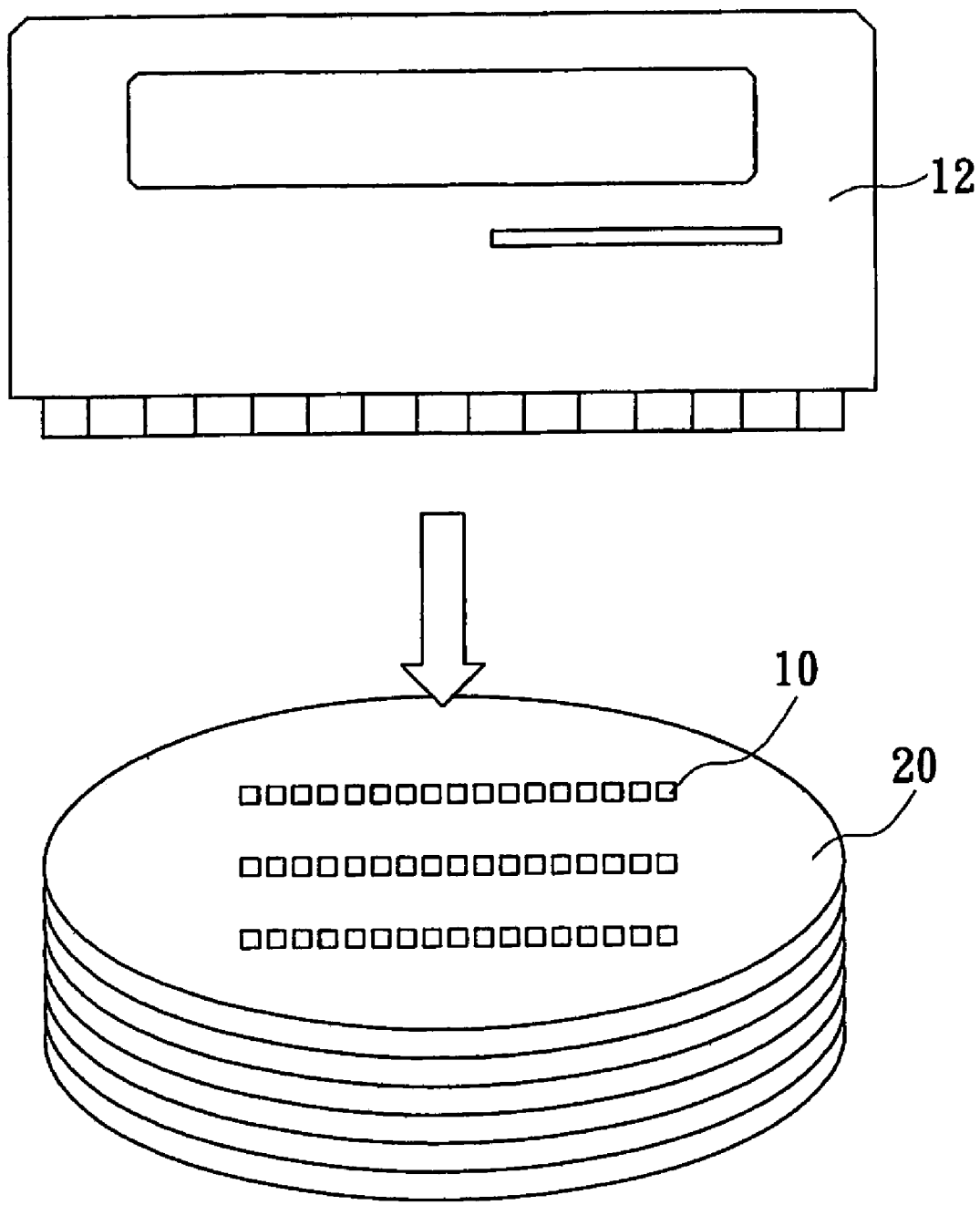
FIG. 2B is a view illustrating the step of mounting the plurality of packaged electronic components onto the testing carrier board according to the embodiment of this invention.

Referring now to FIGS. 3 to 7, 2A, or 2B, a testing method of integration testing for packaged electronic components according to this invention comprises the following steps. A plurality of packaged electronic components 10 or an entire piece of the plurality of packaged electronic components 10 (the plurality of components as shown in FIG. 2B or the entire piece of the plurality of remainder 14 as shown in FIG. 2A) is mounted onto the testing carrier board 20a. Testing chips on the testing carrier board 20 are mounted on the packaged electronic components 10 and then test data given from each packaged electronic component 10 (in FIGS. 3 to 4) are recorded, in which the test data from the component, including all packaged electronic component function lists organized after testing, may be shown and saved with image or literal data (in FIG. 5). The packaged electronic components are classified according to the image or the literal data for packaging (in FIGS. 6 to 7). The plurality of packaged electronic components 10, after being mounted on the testing carrier board 20, may be loaded by a carrier 30 and placed in a movable magazine in order to pass through the entire testing flowchart.

Referring now to FIGS. 2 to 7 for a further detailed description of modification according to an embodiment of this invention, the packaged electronic component 10 may be processed for a QFN package, a DFN package a CSP or a SOP, in which steps of mounting the packaged electronic component 10 onto the testing carrier board 20 may be divided into the following steps (as shown in FIG. 8 for a method flowchart according to this invention): (1) applying viscose onto a plurality of predetermined sites of the testing carrier board (S102); (2) placing the plurality of packaged electronic components 10 on each of the related plurality of predetermined sites (S104); (3) solidifying the viscose (a machine in FIG. 2 being just a machine mounting chips according to the flowchart) (S106), in which the plurality of predetermined sites may be arranged in a matrix.

The viscose may be a UV-ray solidifying glue and UV rays are projected to the plurality of predetermined sites in the viscose solidifying process. The viscose may also be a thermal catalysis solidifying (or curing) glue heating the plurality of predetermined sites with a catalysis temperature lower than that which the packaged electronic components can bear (generally chip packages passing through an SMT production line having above somewhat heatproof capability). The method of testing the packaged electronic components comprises a step of using a predetermined chip-leveling specification table or a chip-type recognition specification table (the two tables may generally be given from an ODM producing batches of chips or from a packaging factory itself and the tables being next input to a controller of an industrial PC 40 as a specific chip tester 42) in order to test each packaged electronic component 10.

Figure 3:
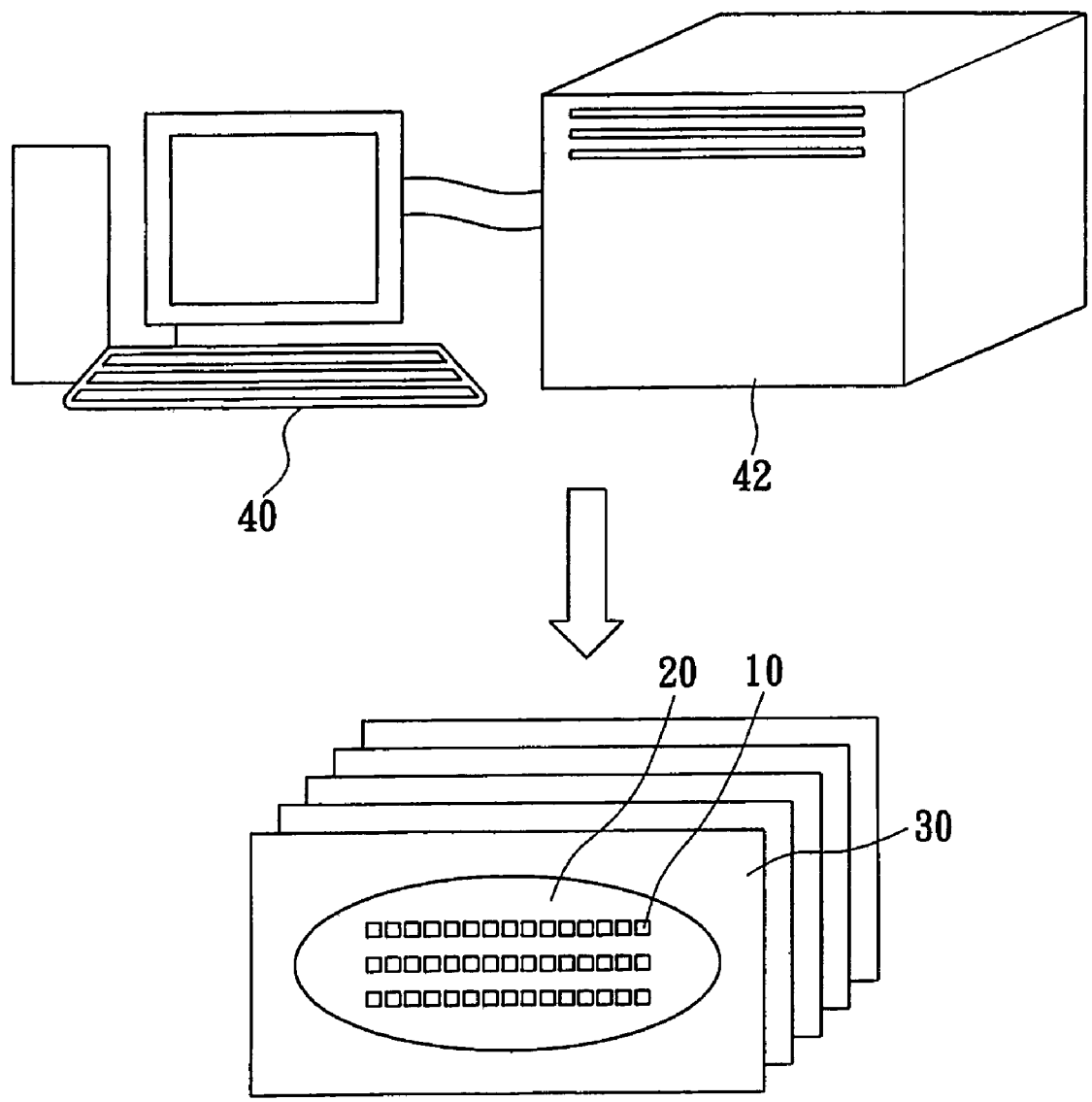
FIG. 3 is a view illustrating a step of testing chips on the testing carrier board mounted on the packaged electronic components according to an embodiment of this invention.
Figure 5:
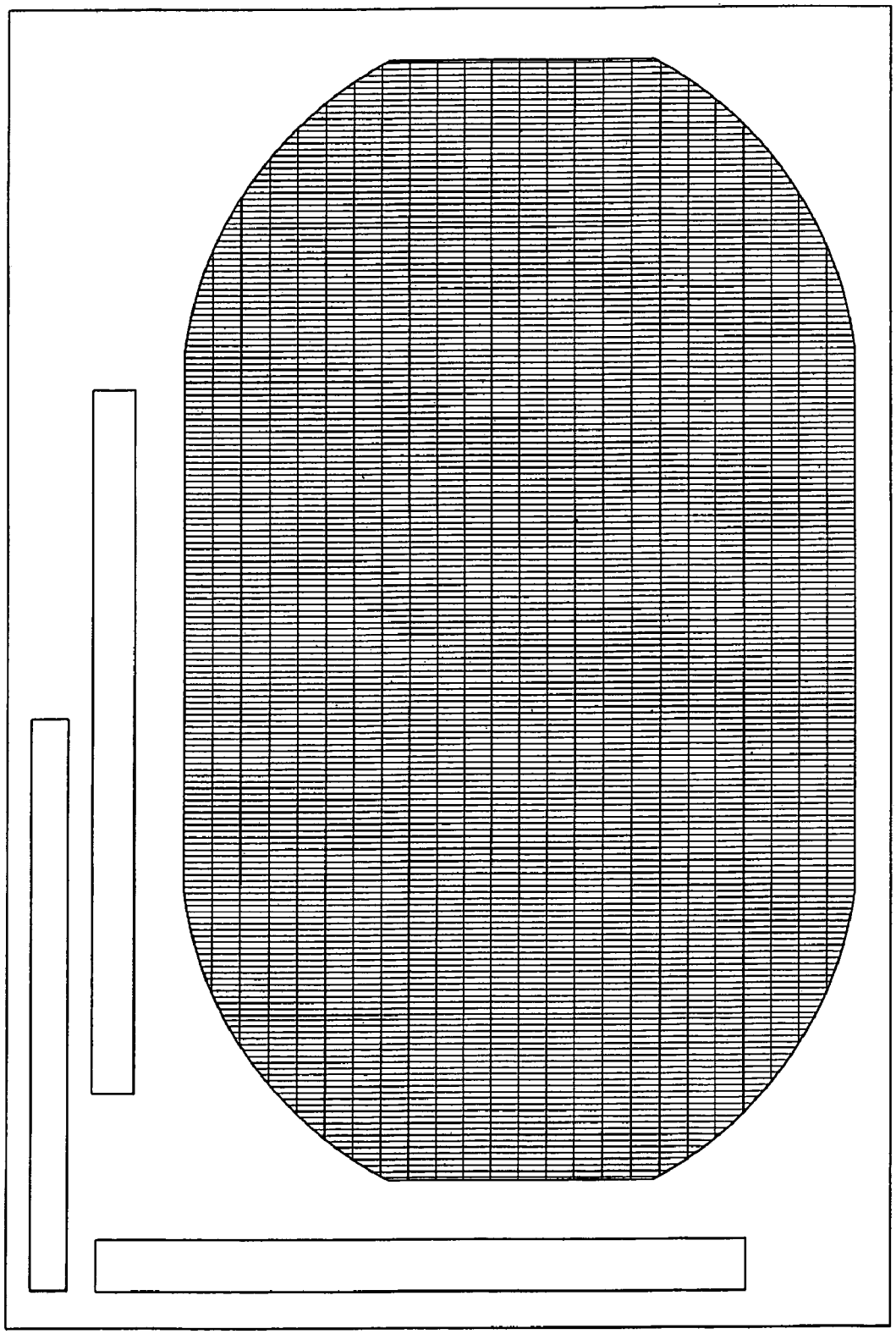
FIG. 5 is a view of test data from the packaged electronic component, including all packaged electronic component function lists organized after testing, that may be shown and saved with image or literal data.
Figure 6:
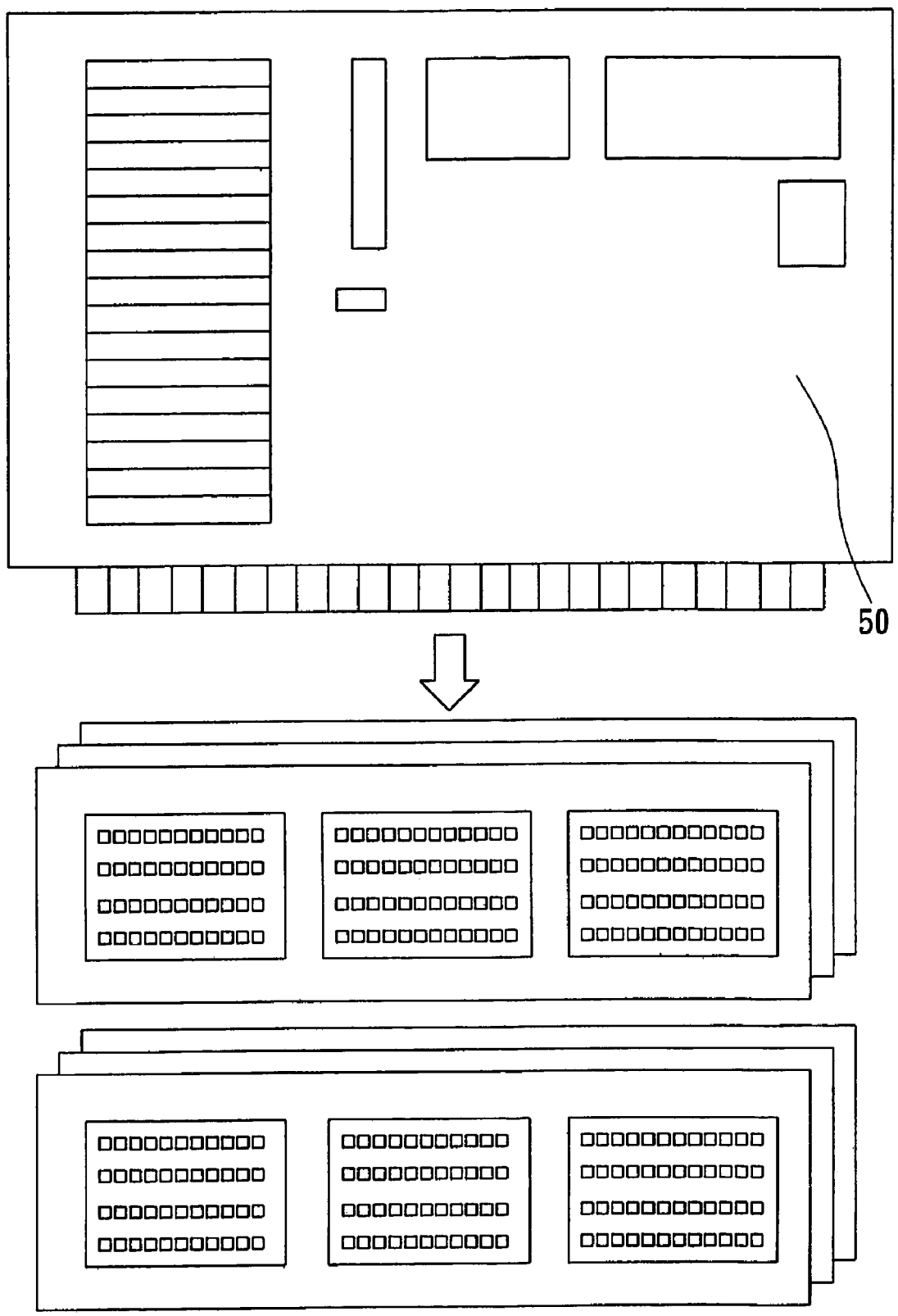
FIG. 6 is a view illustrating a step of classifying the packaged electronic components according to the test data image or the literal data for packaging according to an embodiment of this invention.
Figure 7:
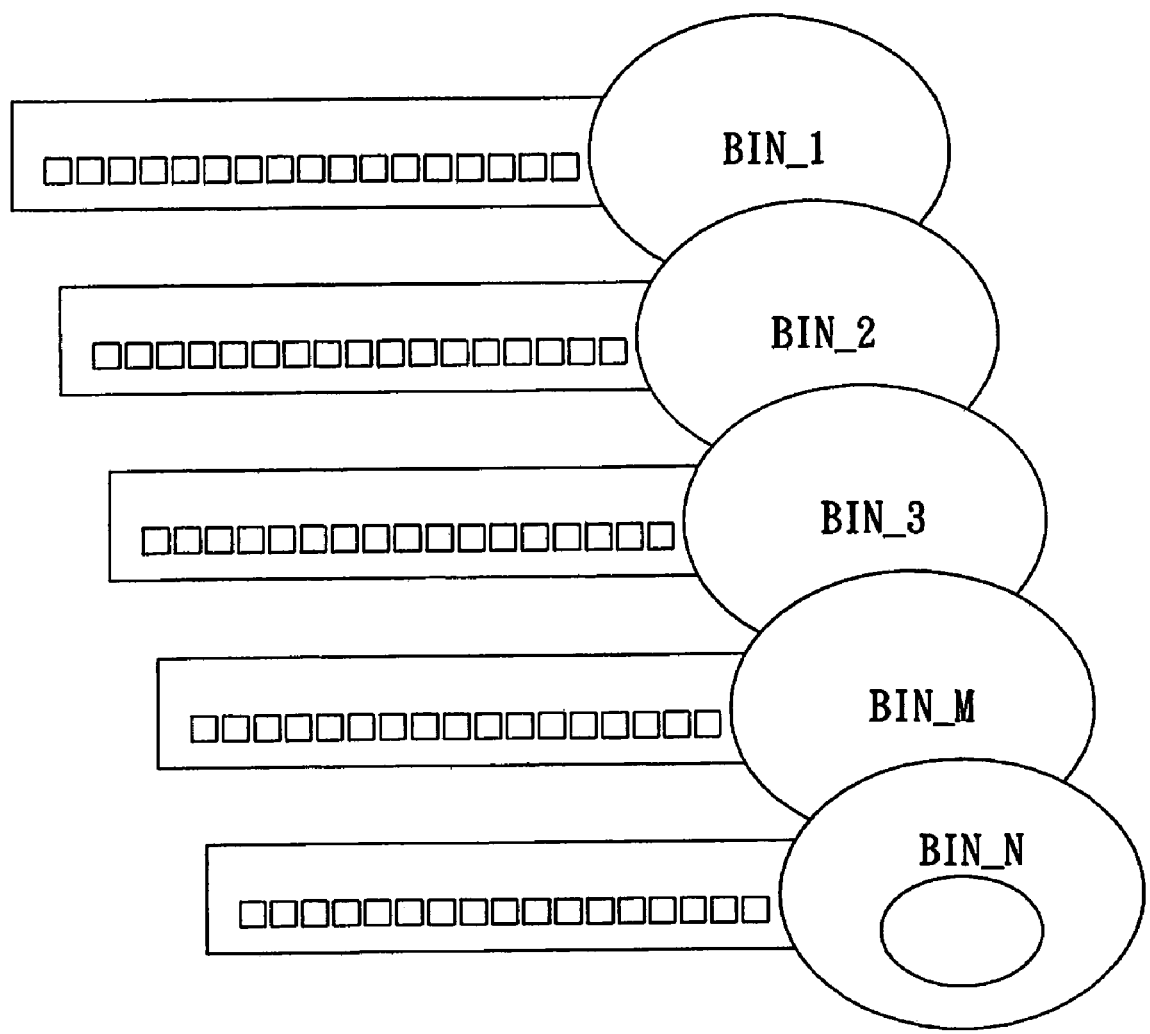
FIG. 7 is a view illustrating chip tape bins after packaging is implemented according to an embodiment of this invention.

After mounting, for functions (the specific tester 42 and the industrial PC 40 being shown for illustration only, as shown in FIG. 3, and a gateway of the movable magazine being generally provided), the tester of this invention is likely shown to test the packaged electronic components 10 mounted on the test carrier board 20 and loaded on the carrier. The packaged electronic components 10 are arranged in a matrix and promptly tested with many sizes and arranged sets of probes. The method of testing the packaged electronic component 10 comprises a step of testing test points on circuits of different types of packaged electronic components 10 or a type of packaged electronic components 10 through a probe, which may change a position or angle. Test data given from each packaged electronic component 10 comprise package bin numbers (as shown in an embodiment of FIG. 4) or batch numbers according to chip functions after the test, a step of mounting the plurality of packaged electronic components 10 onto the test carrier board 20 may be finished through a printing viscose device (similar to an SMT solder paste printing mechanism), a device placing the packaged electronic components 10 (similar to an SMT chip picking and placing device), and a viscose curing device (similar to a mechanism available frequently known in a flowchart of assembly of an electronic device) in sequence. A step of packaging depending on classified outcomes (as shown in FIG. 6 for a machine 50 only illustrating an overall flow of classification and packaging) is finished through a device cutting the test carrier board (similar to a device cutting an LED or optic sensor substrate), a device picking and placing the packaged electronic components (a conventional machine), and a tape packaging device (a conventional machine) in sequence.

In the embodiments of this invention, QFN and DFN packages are not to be construed as limitations, and the other similar or equivalent packages may also be tested in this method for improvement of test precision and package quality.

This invention has the following advantages:
1. Precise alignment and facilitation in testing automation: the printing viscose machine according to this invention presses the packaged electronic components to fit on the test carrier board for decreasing the alignment error and even increases ease of design of an automatic tester, thereby providing economic benefits.
2. Easy classification for packaging: a computer classifies and arranges test data so that this invention further helps for classification of different levels and types of products, as is required for separate loading of chip tapes.
3. Low cost of machinery used in the manufacturing process: the manufacturing process is conveniently implemented and thereby the equipment is of course cheaper and easily obtained, and equipment maintenance is quite easily provided by similar mechanism industries (such as the printing viscose machine).
4. Flexible adjustment in testing production line: the production line performing testing and packaging may be flexibly adjusted through a computer program; for example, different test programs and test probes are used for different batches of products.

However, in the description mentioned above, only the preferred embodiments according to this invention are provided without limit to claims of this invention; all those skilled in the art without exception should include the equivalent changes and modifications as falling within the true scope and spirit of the present invention.

What is claimed is:

1. A method of integration testing for packaged electronic components, comprising the steps of:
   mounting a plurality of packaged electronic components onto a testing carrier board;
   testing chips on the testing carrier board mounted on the packaged electronic components and then recording test data given from each packaged electronic component, wherein the test data from the component, including all packaged electronic component function lists organized after testing, is shown and saved with image or literal data; and
   classifying the packaged electronic components according to the image or the literal data for packaging,
   wherein steps of mounting the packaged electronic component onto the testing carrier board are divided into steps as follows:
   applying viscose onto a plurality of predetermined sites of the testing carrier board; placing the plurality of packaged electronic components on each of the related plurality of predetermined sites; and solidifying the viscose.

2. The method of integration testing for packaged electronic components according to claim 1, wherein the packaged electronic components are processed for a quad flat no-lead (QFN) package, a dual-line flat no-lead (DFN) package, a chip size package (CSP), or a small outline package (SOP).

3. The method of integration testing for packaged electronic components according to claim 1, wherein the plurality of predetermined sites are arranged in a matrix.

4. The method of integration testing for packaged electronic components according to claim 1, wherein the viscose may be a UV-ray solidifying glue and UV rays are projected onto the plurality of predetermined sites in the viscose solidifying process.

5. The method of integration testing for packaged electronic components according to claim 1, wherein the plurality of predetermined sites are heated in the viscose solidifying process and a catalysis temperature is lower than a temperature the packaged electronic components can bear.

6. The method of integration testing for packaged electronic components according to claim 1, wherein the method of testing the packaged electronic components comprises a step of testing the functions of each packaged electronic component mounted by way of a predetermined chip-leveling specification table or a chip-type recognition specification table.

7. The method of integration testing for packaged electronic components according to claim 1, wherein the method of testing the packaged electronic components comprises a step of testing test points on circuits of different types of packaged electronic components or a type of packaged electronic components through a probe with changeable position or angle.

8. The method of integration testing for packaged electronic components according to claim 1, wherein test data given from each packaged electronic component comprise package bin numbers or batch numbers according to chip functions after the test.

9. The method of integration testing for packaged electronic components according to claim 1, wherein a step of mounting the plurality of packaged electronic components onto the test carrier board may be finished in sequence through a printing viscose device, a device placing the packaged electronic components, and a viscose curing device.

10. The method of integration testing for packaged electronic components according to claim 8, wherein a step of packaging depending on classified outcomes is finished through a device cutting the test carrier board, a device picking and placing the packaged electronic components, and a tape packaging device in sequence.

* * * * *